US012630363B2

(12) United States Patent
Kou

(10) Patent No.: US 12,630,363 B2
(45) Date of Patent: May 19, 2026

(54) VERTICAL COMPONENT STORAGE SYSTEM

(71) Applicant: Accu-Assembly Incorporated, Andover, MA (US)

(72) Inventor: Yuen-Foo Michael Kou, Melrose, MA (US)

(73) Assignee: Accu-Assembly Incorporated, Andover, MA (US)

( * ) Notice: Subject to any disclaimer, the term of this patent is extended or adjusted under 35 U.S.C. 154(b) by 882 days.

(21) Appl. No.: 17/692,945

(22) Filed: Mar. 11, 2022

(65) Prior Publication Data

US 2023/0286748 A1      Sep. 14, 2023

(51) Int. Cl.
B65G 1/137      (2006.01)
H05K 13/04      (2006.01)

(52) U.S. Cl.
CPC ......... B65G 1/137 (2013.01); H05K 13/0417 (2013.01)

(58) Field of Classification Search
CPC ........................... B65G 1/137; H05K 13/0417
See application file for complete search history.

(56) References Cited

U.S. PATENT DOCUMENTS

| | | | |
|---|---|---|---|
| 4,352,622 A | 10/1982 | Weischel | |
| 6,450,598 B1 * | 9/2002 | Hanel | B65G 1/127 |
| | | | 312/297 |
| 8,463,425 B2 * | 6/2013 | Hanel | B65G 1/137 |
| | | | 700/215 |

| | | | |
|---|---|---|---|
| 9,205,980 B2 * | 12/2015 | Walter | B65G 1/1373 |
| 9,230,838 B2 | 1/2016 | Jager | |
| 9,731,895 B2 | 8/2017 | Manning et al. | |
| 9,828,178 B2 * | 11/2017 | Stefani | B65G 1/137 |
| 10,772,249 B2 * | 9/2020 | Jacobsson | H05K 13/0417 |

(Continued)

FOREIGN PATENT DOCUMENTS

| | | |
|---|---|---|
| CN | 113734669 | 12/2021 |
| DE | 102018115697 A1 | 1/2020 |

(Continued)

OTHER PUBLICATIONS

International Search Report and Written Opinion in International Appln. No. PCT/US2023/064166, dated Jun. 27, 2023, 9 pages.

(Continued)

*Primary Examiner* — Kyle O Logan
(74) *Attorney, Agent, or Firm* — Fish & Richardson P.C.

(57) ABSTRACT

Implementations of the present disclosure include a component storage and retrieval system that includes a storage stack, an operator access station, and an automated elevator. The storage stack defines discrete tray storage locations. The operator access station includes a surface adapted to support a tray. The automated elevator moves a tray from the access station surface to a designated one of the discrete tray storage locations, and retrieves a selected tray from the storage stack and brings the selected tray to the access station. The access station includes a camera positioned such that a tray supported on the surface is within a field of view of the camera. The camera generates data representing an image of the tray, from which the system identifies a component on the tray, and determines where on the tray the component is located. The system communicates the identified location to an operator.

19 Claims, 9 Drawing Sheets

(56) References Cited

U.S. PATENT DOCUMENTS

| | | | |
|---|---|---|---|
| 11,126,807 B2 | 9/2021 | Wagner et al. | |
| 2003/0046808 A1* | 3/2003 | Eskang | H05K 13/0417 |
| | | | 29/650 |
| 2003/0147738 A1* | 8/2003 | Hanel | B65G 1/137 |
| | | | 700/214 |
| 2008/0237167 A1* | 10/2008 | Hanel | B65G 1/02 |
| | | | 211/183 |
| 2009/0312864 A1* | 12/2009 | Hanel | B65G 1/1373 |
| | | | 700/214 |
| 2011/0035045 A1* | 2/2011 | Walter | F02M 63/0036 |
| | | | 700/214 |
| 2014/0017822 A1* | 1/2014 | Sakai | H01L 21/6836 |
| | | | 438/15 |
| 2016/0236865 A1 | 8/2016 | Altemir | |
| 2016/0366797 A1* | 12/2016 | Sumi | H05K 13/0812 |
| 2017/0027091 A1* | 1/2017 | Jakobsson | H05K 13/0417 |
| 2017/0073159 A1 | 3/2017 | Lossov et al. | |
| 2017/0121112 A1* | 5/2017 | Stefani | G01C 15/004 |
| 2017/0235878 A1* | 8/2017 | DeBusk | G16H 40/20 |
| | | | 705/2 |
| 2021/0039884 A1 | 2/2021 | Tosun et al. | |
| 2021/0070552 A1 | 3/2021 | Mcvaugh et al. | |
| 2021/0183107 A1* | 6/2021 | Lin | H04N 23/54 |
| 2021/0276805 A1 | 9/2021 | Rongley | |
| 2023/0064045 A1* | 3/2023 | Iwasaki | H05K 13/02 |

FOREIGN PATENT DOCUMENTS

| | | | |
|---|---|---|---|
| EP | 0322313 A1 | 6/1989 | |
| EP | 2035301 B1 | 10/2011 | |
| IT | TO20130976 A1 | 5/2015 | |
| JP | 2008-037561 | 2/2008 | |
| KR | 10-2006-0038329 | 5/2006 | |
| KR | 10-1495641 | 2/2015 | |
| KR | 10-2017-0050210 | 5/2017 | |
| WO | WO2020057246 A1 | 3/2020 | |
| WO | WO2020200739 A1 | 10/2020 | |

OTHER PUBLICATIONS

Extended European Search Report in European Appln. No. 23767756.2, mailed on Aug. 19, 2025, 10 pages.

* cited by examiner

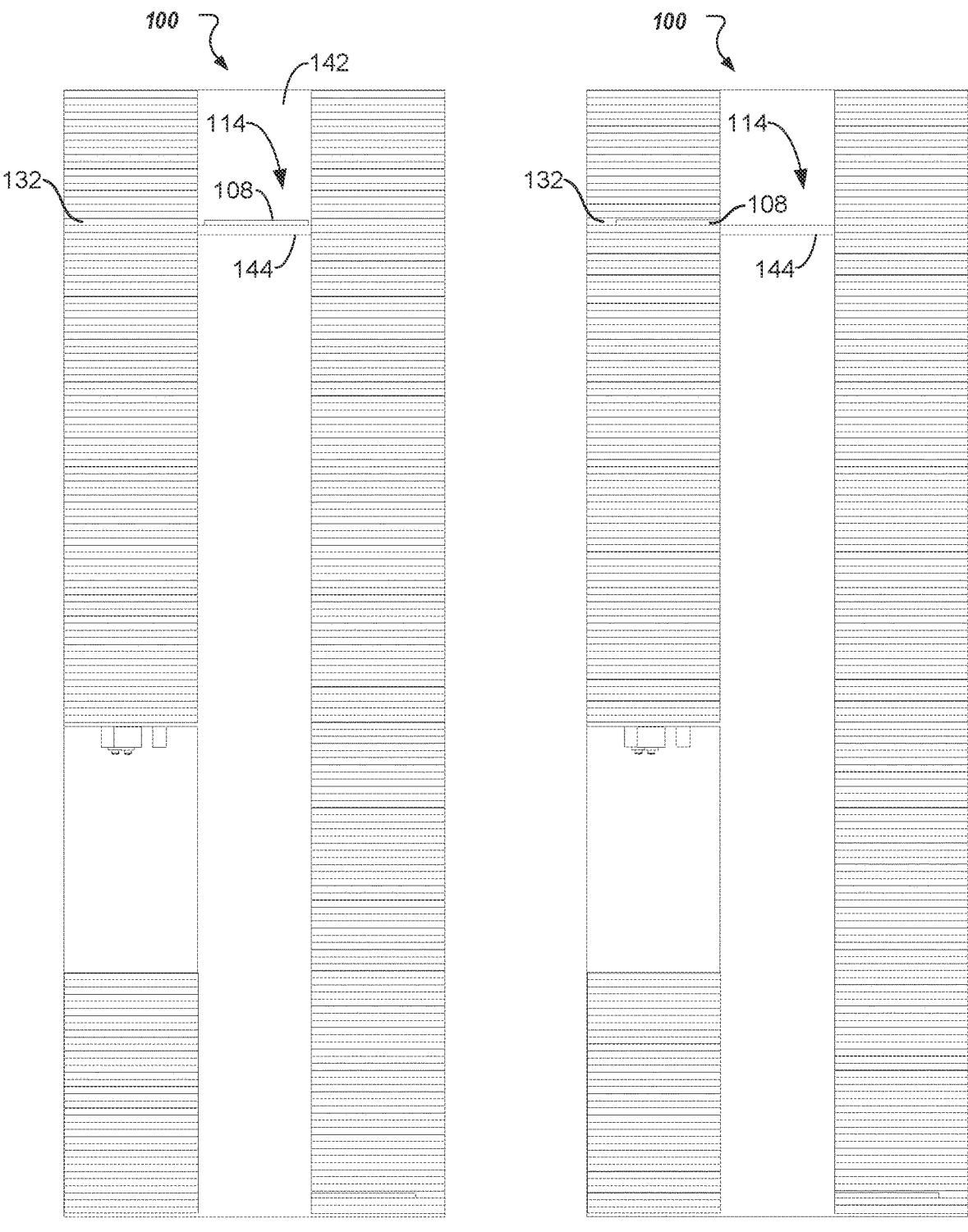
FIG. 4                                    FIG. 5

VERTICAL COMPONENT STORAGE SYSTEM

FIELD OF THE DISCLOSURE

This disclosure relates generally to storage systems, and more particularly electronic component reel storage and inventory management systems.

BACKGROUND OF THE DISCLOSURE

Storing electronic component reels and managing a large inventory of reels can be costly and time-consuming. Storing and retrieving small items in large stacks or piles can present many challenges. In some cases, finding and storing specific reels within a large group of items can be especially difficult. Some challenges include finding ways to optimally utilize dedicated rack space and finding ways to quickly store and retrieve reels using automated equipment. Methods for improving storage systems are sought.

SUMMARY

Implementations of the present disclosure include a component storage and retrieval system that includes a storage stack, an operator access station, and an automated elevator. The storage stack defines discrete tray storage locations at different levels. The operator access station includes a surface adapted to support a movable tray. The automated elevator moves a tray from the access station surface to a designated one of the discrete tray storage locations of the storage stack, and retrieves a selected tray from the storage stack and brings the selected tray to the access station. The access station includes a fixed camera positioned such that a tray supported on the surface is within a field of view of the camera, with the field of view spanning multiple discrete component storage locations of the tray. The camera generates data representing an image of the tray, from which the system (a) identifies a component on the tray, and (b) determines where on the tray the component is located. The system communicates the identified discrete component storage location to an operator at the operator access station.

In some implementations, the storage stack includes a vertical storage rack including a frame defining a plurality of stacked bays each arranged to receive and store a respective tray, and each one of the discrete tray storage locations includes a bay of the plurality of stacked bays.

In some implementations, the operator access station includes a first bay of the plurality of stacked bays. The first bay defines a height larger than a height of the rest of bays of the plurality of stacked bays.

In some implementations, the operator access station includes a ceiling spaced from the surface of the operator access station, and the camera is fixed to the ceiling over the tray with the field of view of the camera directed toward the tray supported on the surface of the operator access station. In some implementations, the field of view of the camera spans all of the discrete component storage locations of the tray. In some implementations, the system further includes one or more additional cameras fixed to the ceiling of the operator access station. The fixed camera is arranged such that the field of view of the fixed camera spans a first group of the multiple discrete component storage locations, and the one or more additional cameras are arranged such that field of view of the one or more additional cameras span a second group of the multiple discrete component storage locations different than the first group.

In some implementations, the automated elevator includes i) an elevator drive coupled to a frame of the storage stack, ii) an elevator chain engaged with and configured to be driven by the elevator drive, iii) and an extractor attached to the elevator chain. The elevator drive includes a rotatable gear engaged with the elevator chain such that rotation of the gear moves the extractor vertically to position the extractor adjacent a selected of the discrete tray storage locations to store or retrieve a respective tray.

In some implementations, the extractor includes i) an extractor drive including an extractor gear, ii) an extractor chain engaged with and configured to be driven by the extractor drive, and iii) one or more tabs secured to and movable by the extractor chain along a horizontal plane of the extractor. The one or more tabs are arranged to engage, upon rotation of the extractor gear, a respective tray to move the respective tray to and from a support surface of the extractor to store or retrieve the respective tray.

In some implementations, the system further includes an illumination source attached to or near the operator access station and configured to radiate light. The storage and retrieval system, during retrieval of a component on a tray, communicate an identified component location to the operator at the operator access station by radiating the light on the identified component on the tray.

In some implementations, each discrete component storage location of the tray include an identifier including at least one of a marker or a machine readable code. The identifier is exposed when no component is in the discrete component storage location, and covered when a component is in the discrete component storage location. The system determines, based on a presence or absence of the identifier in the image, which one of the discrete component storage locations is empty and which one of the discrete component storage locations contains a component.

In some implementations, each component includes a unique component machine readable code associated with the respective component. The system associates the unique component machine readable code of each component with the tray and with a respective discrete component storage location within the tray.

In some implementations, the component includes an electrical component reel or a hand tool.

Implementations of the present disclosure also include a component storage and retrieval system. The system includes a storage stack, an operator access station, an automated elevator, and a set of trays. The storage stack defines discrete tray storage locations at different levels. The operator access station includes a surface adapted to support a movable tray. The automated elevator moves a tray from the access station surface to a designated one of the storage locations of the storage stack, and retrieves a selected tray from the storage stack and brings it to the access station. The set of trays are adapted to be accommodated in at least one of the tray storage locations of the storage stack, and on the operator access station surface, and to be carried by the automated elevator. Each tray defines multiple discrete reel positioning areas. Each area bears a mark that is visible from above the tray when the area is void of reels. The access station includes a fixed camera positioned such that a tray of the set of trays is within a field of view of the camera when supported on the surface. The field of view spans the multiple discrete reel positioning areas of the tray. The camera generates data representing an image of the tray, from which the system is configured to (a) identify whether a reel is disposed in each of the reel positioning areas of the tray; (b) identify a reel positioned on the tray, and (c)

associate the identified reel with one of the reel positioning areas based on where the identified reel is located. The system communicates the identified reel location to an operator at the operator access station.

In some implementations, the storage stack includes a vertical storage rack including a frame defining a plurality of stacked bays each arranged to receive and store a respective tray, and each one of the discrete tray storage locations includes a bay of the plurality of stacked bays.

In some implementations, the operator access station includes a ceiling spaced from the surface of the operator access station, and the camera is fixed to the ceiling over the tray with the field of view of the camera directed toward the tray supported on the surface of the operator access station.

In some implementations, the field of view of the camera spans all of the discrete component storage locations of the tray.

In some implementations, the system also includes one or more additional cameras fixed to the ceiling of the operator access station. The fixed camera is arranged such that the field of view of the fixed camera spans a first group of the multiple discrete component storage locations, and the one or more additional cameras are arranged such that the field of view of the one or more additional cameras span a second group of the multiple discrete component storage locations different than the first group.

In some implementations, each discrete component storage location of the tray include an identifier including at least one of a marker or a machine readable code. The identifier is exposed when no component is in the discrete component storage location, and covered when a component is in the discrete component storage location. The system determines, based on a presence or absence of the identifier in the image, which one of the discrete component storage locations is empty and which one of the discrete component storage locations contains a component.

In some implementations, each component includes a unique component machine readable code associated with the respective component, and the system can associate the unique component machine readable code of each component with the tray and with a respective discrete component storage location within the tray.

Implementations of the present disclosure also include a method that includes receiving, by a processing device and from a camera of a component storage and retrieval system, data representing an image of at least a portion of a tray. The component storage and retrieval system include i) a storage stack defining discrete tray storage locations at different levels, ii) an operator access station including a tray support surface, and iii) an automated elevator configured to move a tray between the tray support surface and a designated one of the storage locations of the storage stack. The image includes multiple discrete component storage locations of the tray. The method also includes identifying, by the processing device and based on the data received from the camera, a component on the tray. The method also includes determining, by the processing device and based on the data received from the camera, where on the tray the component is located. The method also includes communicating the identified discrete component storage location to an operator at the operator access station.

Particular implementations of the subject matter described in this specification can be implemented so as to realize one or more of the following advantages. For example, the vertical reel component storage system of the present disclosure can have a small physical footprint while providing high-density storage. Additionally, the vertical reel component storage system of the present disclosure can automatically detect incoming components to be stored and automatically retrieve components from the storage locations. Furthermore, the system and methods of the present disclosure can be implemented on existing equipment. Additionally, the vertical reel component storage system can increase the accuracy in inventory and storage, which can prevent wrong parts from being used or sent to production lines. Additionally, the vertical reel component storage system can increase the turnaround from Work in Progress (WIP) to stock. Additionally, the vertical reel component storage system can shorten inventory turn.

BRIEF DESCRIPTION OF THE DRAWINGS

FIGS. 2-5 are side, schematic views of sequential steps of storing a component in the vertical component storage system in FIG. 1.

DETAILED DESCRIPTION OF THE DISCLOSURE

The vertical component storage system of the present disclosure includes a vertical storage rack with multiple bays to store carriers (e.g., trays or pallets) that contain one or more electronic component reels. The vertical storage rack has an operator access station where an operator can access the trays to retrieve or store trays. The vertical component storage system includes an elevator that moves the trays between the operator access station and storage bays of the vertical storage rack to store or retrieve trays.

Figure 1:
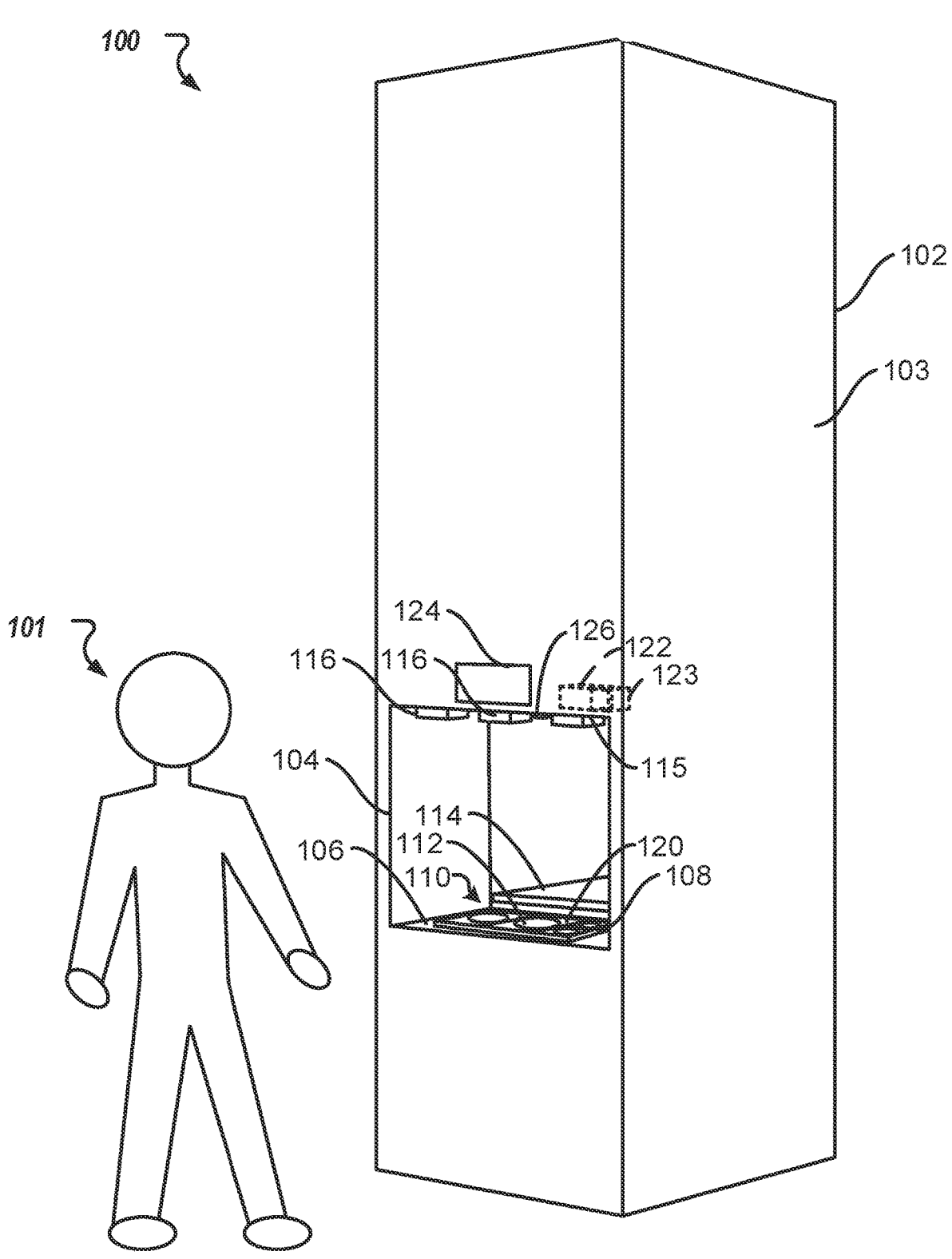
FIG. 1 is a perspective, schematic view of a vertical component storage system according to implementations of the present disclosure.

FIG. 1 depicts a vertical component storage system 100 that includes a storage stack 102 (e.g., a vertical storage rack) to store multiple components 110. The components 110 can be tape reels used in surface mount technology (SMT) systems. Tape reels are used in the production of electronic circuits, in which electronic components from tape reels are placed directly onto the surface of printed circuit boards. SMT board population requires many different components, and the specific list of components will change with each board design being produced. This requires manufacturers to maintain and manage inventories of hundreds, if not thousands, of different reels. Furthermore, partial reels often must be returned to inventory when switching from one run to the next. Managing the large tape reel inventory can be challenging. The vertical component storage system 100 leverages cameras or image sensors, data querying, and vertical lift technology to provide an effective storage system. The vertical component storage system 100 is not limited to storing tape reels. For example, the vertical component storage system 100 can be used to store narrow hand tools or other small electronic components such as printed circuits.

An operator 101 can use the vertical component storage system 100 to store and retrieve components to and from the system 100. The storage stack 102 has a housing 103 that defines, inside the housing 103, discrete tray storage locations (see FIGS. 2-7) at different levels or heights of the storage stack 102. Each discrete tray storage location can store one or more trays of components.

The vertical component storage system 100 also includes an operator access station or loading station 104 that has a surface 106 that supports a movable tray or pallet 108. The tray 108 contains one or more components 110 such as electronic component reels 112. The vertical component storage system 100 also has an automated elevator 114 that moves the tray 108 from the surface 106 of the operator access station 104 to a designated one of the discrete tray storage locations of the storage stack 102. The automated elevator 114 also retrieves selected trays from the storage stack 102 and brings the trays 108 to the operator access station 104, where the operator 101 can retrieve the tray 108 or a component 112 of the tray 108. When the component 112 has been retrieved, the operator 101 can press a button or otherwise input instructions to indicate that the operation is finish so the system can take the tray 108 back to its storage location.

The operator access station 104 has one or more cameras 116 attached or fixed to a wall or ceiling 115 of the operator access station 104. The ceiling 115 can be spaced from the surface 106 of the operator access station 104 a distance of, for example, between 600 and 1000 millimeters. The height of the ceiling 115 can dependent on the combination of camera and lens characteristics, as well as on the consideration of a minimum height needed for operator easy access to the reels on the tray and at the same time maximizing the storage space above the operator access station 104. The cameras 116 can be, for example, 20 megapixel digital cameras. Furthermore, the cameras 116 can be monochrome (e.g., black and white) cameras. Monochrome cameras can have a high image resolution as opposed to color cameras, where there is color interpolation (e.g., Bayer pattern) between pixels.

Additionally, the cameras 116 can be fitted on a motion system to move the field of view of the cameras. For example, instead of using two different cameras at points A and B in the ceiling 115, a single camera can move between points A and B. The single camera can move between points A and B to perform the same function that the two cameras would perform.

The cameras 116 are positioned such that the tray 108 supported on the surface 106 is within a field of view of the cameras 116. The field of view spans multiple discrete component storage locations 120 of the tray 108. Each location 120 is arranged to receive one component 110.

The vertical component storage system 100 includes a computer or processing device 122 communicatively coupled to the cameras 116. The processing device 122 can reside over the operator access station 104 (as shown in FIG. 1) or can reside at a different location such as at a bottom end of the storage stack 102 or outside of the storage stack 102. The cameras 116 generate data that represents an image of the tray 108. The processing device 122 can, based on data received from the camera, (a) identify a component 110 on the tray 108, and (b) determine where on the tray 108 (e.g., in which component storage location 120 of the tray 108) the component 112 is located.

The processing device 122 can also output information to communicate the identified discrete component storage location 120 to the operator 101 at the operator access station 104. For example, the processing device can be communicatively coupled to an electronic user interface 124 to transmit the location information for the user interface electronic display 124 to display the information. Additionally, the processing device 122 can be communicatively coupled to an one or more illumination sources 126 (e.g., a laser or an LED light). The illumination source 126 can also be attached to a wall or the ceiling 115 of the operator access station 104, or can otherwise reside near the operator access station 104. During the retrieval of a component, the processing device 122 can transmit information to the illumination source 126 so that the illumination source 126 radiates, based on the information received from the processing device 122, light unto the component that is to be retrieved from the tray. For example, the system can include multiple illumination sources 126, with each illumination source 126 pointing at a respective location of the tray 108.

The processing device 122 is communicatively coupled to or includes a controller 123. The controller 123 is operably coupled to the automated elevator 114 to control, based on information received from the processor, the vertical and horizontal movement of the elevator 114 (e.g., the up and down movement and the loading and unloading movement). Additionally, the controller 123 can control other components of the system 100, such as the cameras 116 and the illumination source 126.

The controller 123 can be coupled to multiple components of the automated elevator 114. The controller 123 can reside above the operator access station 104. In some implementations, the controller 123 can reside at the automated elevator 114 or a different location of the vertical component storage system 100. In some implementations, the controller 123 can be implemented as a distributed computer system disposed partly at the vertical component storage system 100 and partly outside the vertical component storage system 100. The computer system can include one or more processors and a computer-readable medium storing instructions executable by the one or more processors to perform the operations described here. In some implementations, the controller 123 can be implemented as processing circuitry, firmware, software, or combinations of them.

Figures 2, 3:
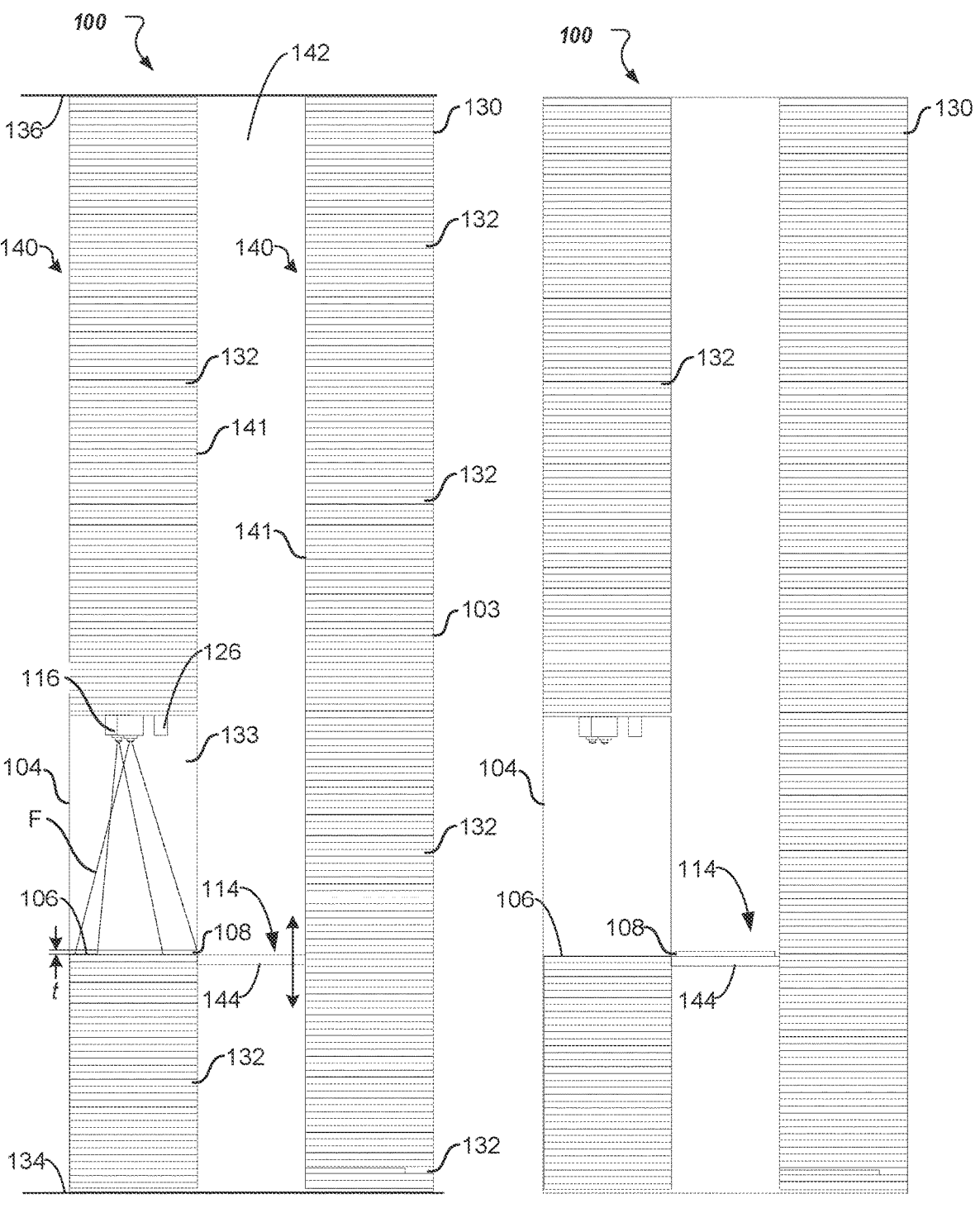

Referring now to FIG. 2, the vertical component storage system 100 has a frame 130 (e.g., the frame of the storage stack 102) that defines tray storage locations 132 (e.g., multiple stacked bays or slots) each arranged to receive and store one or more trays 108. The frame 130 can be supported on a floor 134 of a building or room in which the vertical component storage system 100 resides, and can extend to or near a ceiling 136 of the building or room. The frame 130 of the vertical component storage system 100 can have a height of, for example, between 2 and 8 meters, depending on the height of the ceiling 136 and the design specifications of the system 100. Additionally, the frame 130 of the vertical component storage system 100 can have a foot print of, for example, between 1.5 and 3 (e.g., 2.2) square meters or more, depending on the size and shape of the trays 108 and field of view of the cameras. Thus, the vertical component storage system 100 can have a small footprint while providing high-density storage. The storage stack 102 can store, for example, between 2000 and 1000 (e.g., 4500) reels or components.

The cameras 116 are positioned such that the tray 108 supported on the surface 106 of the operator access station 104 is within a field of view "F" of the camera 116. The field of view "F" spans multiple discrete component storage locations of the tray 108. For example, the field of view "F" of the cameras 116 can span the entire tray 108 (e.g., all of the discrete component storage locations of the tray 108) or part of the tray 108 (e.g., one or a group of the discrete component storage locations of the tray 108). In some implementations, the field of view "F" of the camera 116 can span the entire support surface 106 of the operator access station 104. The field of view "F" of each camera 116 is directed toward the tray 108 and the components residing on the tray 108. For example, one camera 118 can be arranged on the ceiling of the operator access station 104 such that the field of view "F" of the camera spans a first group of the multiple discrete component storage locations of the tray 108, and a second camera 116 or a second group of cameras 116 are oriented such that the field of view of the second camera 116 or the second group of cameras 116 spans a second group of the multiple discrete component storage locations different than the first group.

The cameras can be fixed to the ceiling of the access station 104 or can be movable. For example, one camera or a group of cameras can be mounted on a motion system (e.g., a moving platform) over or otherwise near the surface 106 to allow the cameras to move their field of view with respect to the trays 108 to cover the entire area of one or more trays 108. The processor can determine the position of each camera and determine the position of the components in the tray based on the position of the camera.

The vertical component storage system 100 can have two columns 140 of bays 132. The columns 140 can be separated by an elevator volume or enclosure 142 where the automated elevator 114 resides. Each bay 132 has a floor or support surface and a ceiling. For example, each bay 132 has a volume defined between a respective floor and ceiling, in which the ceiling is the bottom surface of the floor of the next bay. Each bay 132 can have an open end facing the elevator enclosure 142 to receive a tray from the automated elevator 114. Each bay 132 has side and back walls defined by the housing 103 of the vertical component storage system 100.

Each bay 132 can have a height defined between its respective floor and ceiling that is slightly larger than a thickness "t" of the trays 108. For example, if the tray 108 has a thickness "t" of about 16 millimeters, each bay 132 can have a height (e.g., a pitch) of, for example, between 20 to 30 (e.g., 27) millimeters or more. The pitch can be the same across each slot. However, some slots can 'skip' a pitch so that the spacing between trays is double (e.g., 54 millimeters) the pitch of one slot. The system 100 can determine where each tray will be stored depending on the thickness of the reels on the tray.

Each bay 132 can have a different height and width. The width of each bay 132 can be defined by the side walls of the housing 103 or by internal walls inside the housing 103. In some implementations, the vertical component storage system 100 can be arranged without the housing 103 such that the bays 132 are exposed to an exterior environment on which the operator resides.

The operator access station 104 can be arranged as a bay 133 of the stacked bays 132. For example, the bay 133 has a height larger than a height of the rest of bays 132, but can have a width that is equal or similar to the width of the stacked storage bays 132. The operator access station 104 is open on an end facing the operator and is open on the opposite end facing the middle elevator enclosure 142.

The automated elevator 114 includes an extractor 144 that includes a car or platform that moves vertically along the elevator enclosure 142 of the vertical component storage system 100 to store and retrieve trays 108. For example, the extractor 144 moves up and down along the height of the component storage system 100 to move trays 108 between the operator access station 104 and a selected storage bay 132. In some implementations, the extractor 144 can pick a top tray 108 of a stack of trays supported on the surface 106 of the operator access station 104.

As further described in detail below with respect to FIGS. 10 and 11, once the operator places a tray 108 on the support surface 106 of the operator access station 104, the vertical component storage system 100 can automatically detect at least one of: i) which tray storage location of the tray 108 is empty and which one has a component, ii) which component is in which tray storage location, iii) if a component has been placed upside down in its respective tray storage location, and iv) an identifier (e.g., an ID number) of the tray 108. Once the vertical component storage system 100 identifies the components in the tray 108 and associates each component with its respective tray storage location of the tray 108, the vertical component storage system 100 determines in which bay 132 the tray 108 will be stored. For example, each bay 132 can be associated with a tray identifier so that the vertical component storage system 100 stores each tray 108 in its designated bay 132.

Referring to FIGS. 2 and 3, once the vertical component storage system 100 associates the components to the tray 108 and the tray to its designated bay 132, the extractor 144 moves the tray 108 from the support surface 106 of the operator access station 104 to a top surface of the extractor 144. Then, the automated elevator 114 can move the extractor 144 up or down to the selected or designated bay. As shown in FIG. 3, the extractor 144 can be placed with its top surface generally aligned or adjacent the support surface 106 of the operator access station 104, and then engage an end of the tray 108 to move the tray 108 to the top surface of the extractor 144.

Referring now to FIGS. 4 and 5, with the tray 108 loaded on the extractor 144, the automated elevator 114 moves the extractor 144 vertically along the elevator enclosure 142 to the designated storage bay 132 where the tray 108 is to be stored. As shown in FIG. 5, once the tray 108 is aligned with the open end of the designated bay 132, the extractor 144 moves the tray 108 from the top surface of the extractor 144 to the interior volume of the bay 132. In some implementations, to align the tray 108 with the open end of the bay 132, the top surface of the extractor 144 can be aligned with (e.g., disposed along a common plane) the floor of the designated bay 132.

Figures 6, 7:
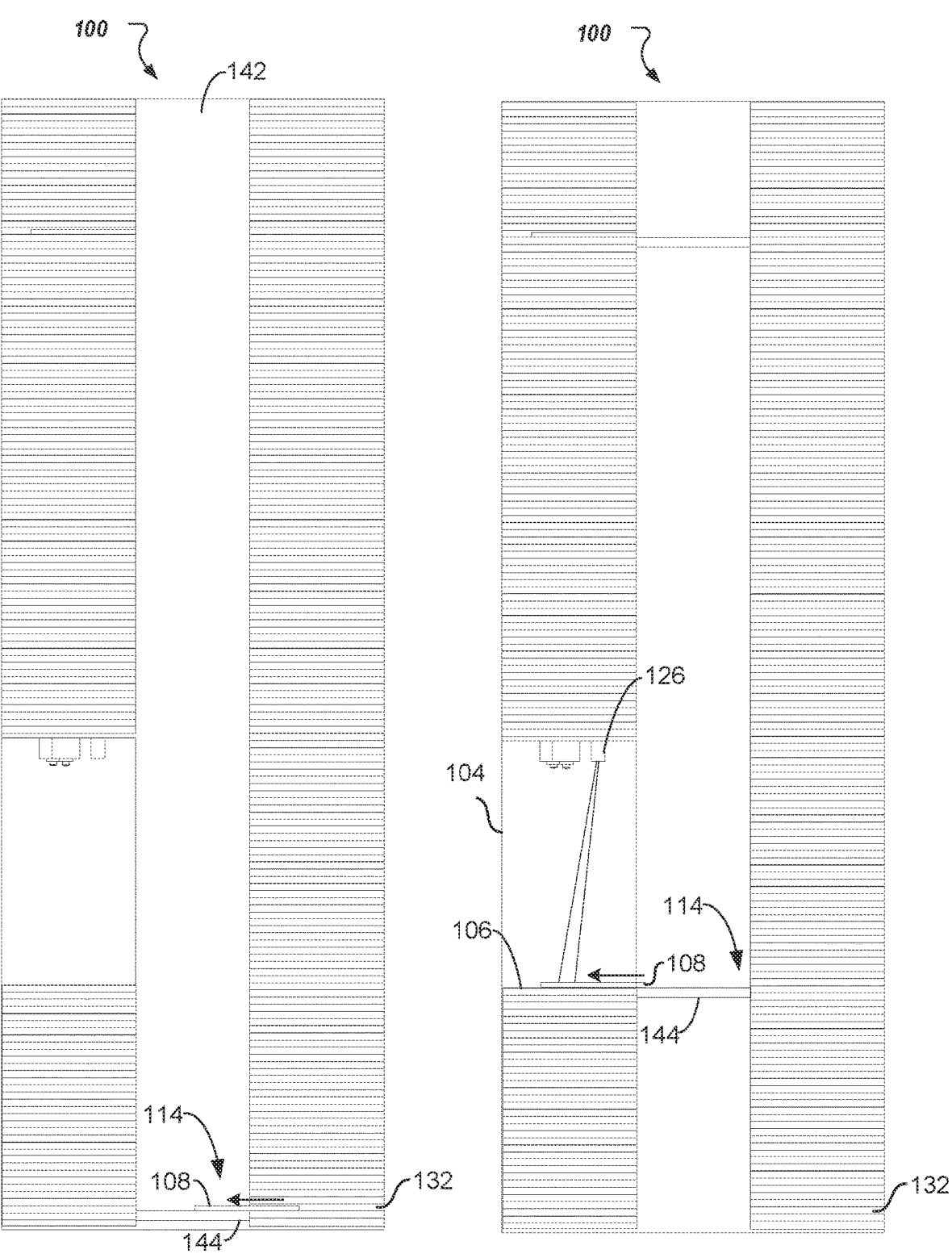
FIGS. 6-7 are side, schematic views of sequential steps of retrieving a component from the vertical component storage system in FIG. 1.

As shown in FIGS. 6 and 7, the vertical component storage system 100 retrieves trays 108 from their designated storage bay 132 to place the tray 108 on the operator access station 104. For example, to retrieve a component, the operator can input (e.g., by using the electronic user interface 124 shown in FIG. 1) into the vertical component storage system 100 information indicating which component is to be retrieved. Based on the input information, the vertical component storage system 100 determines in which bay 132 is the tray 108 that contains the component to be retrieved.

With the extractor 144 empty (e.g., without a tray 108 loaded on the extractor), the automated elevator 114 moves the extractor 144 vertically along the elevator enclosure 142 to the storage bay 132 from which the tray 108 is to be removed. As shown in FIG. 6, the extractor 144 can be placed with its top surface generally aligned or adjacent the floor of bay 132 containing the tray 108 to be retrieved. Once the extractor 144 is adjacent the tray 108, the extractor 144 engages an end of the tray 108 to move the tray 108 from the bay 132 to the top surface of the extractor 144. As shown in FIG. 7, with the tray 108 loaded on the extractor 144, the automated elevator 114 moves the extractor 144 vertically along the elevator enclosure 142 to the operator access station 104. Once the tray 108 is aligned with the surface 106 of the operator access station 104, the extractor 144 moves the tray 108 from the top surface of the extractor 144 support surface 106 of the operator access station 104.

As depicted in FIG. 7, with the tray 108 on the support surface 106 of the operator access station 104, the vertical component storage system 100 detects the tray 108 and indicates to an operator standing near the operator access station 104 the tray storage location of the component to be retrieved. For example, the illumination source 126 of the vertical component storage system 100 can radiate light unto the component or components that are to be retrieved from the tray 108.

Figure 8:
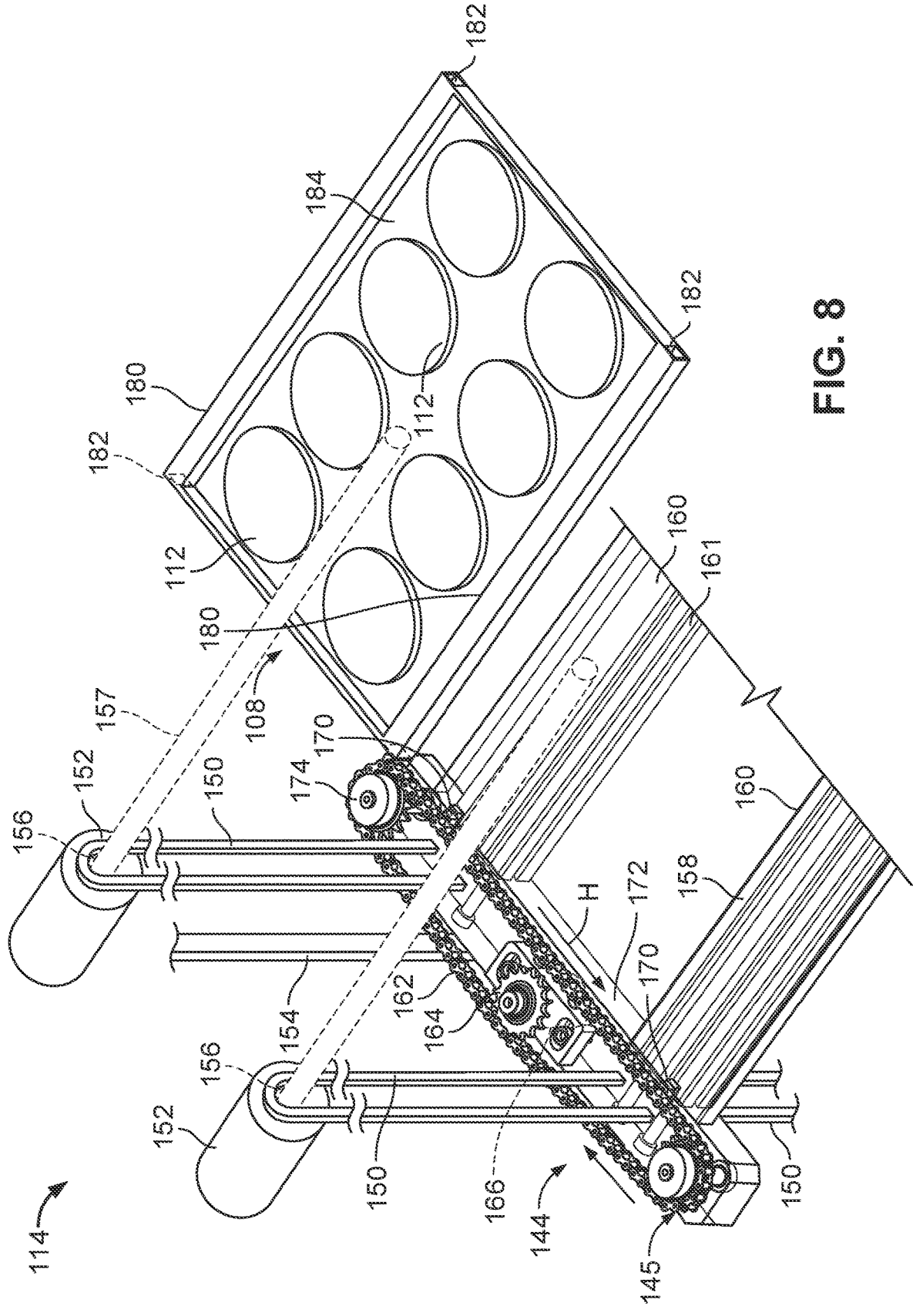
FIGS. 8-9 are perspective views of sequential steps of loading or unloading a tray to and from an extractor.
Figure 9:
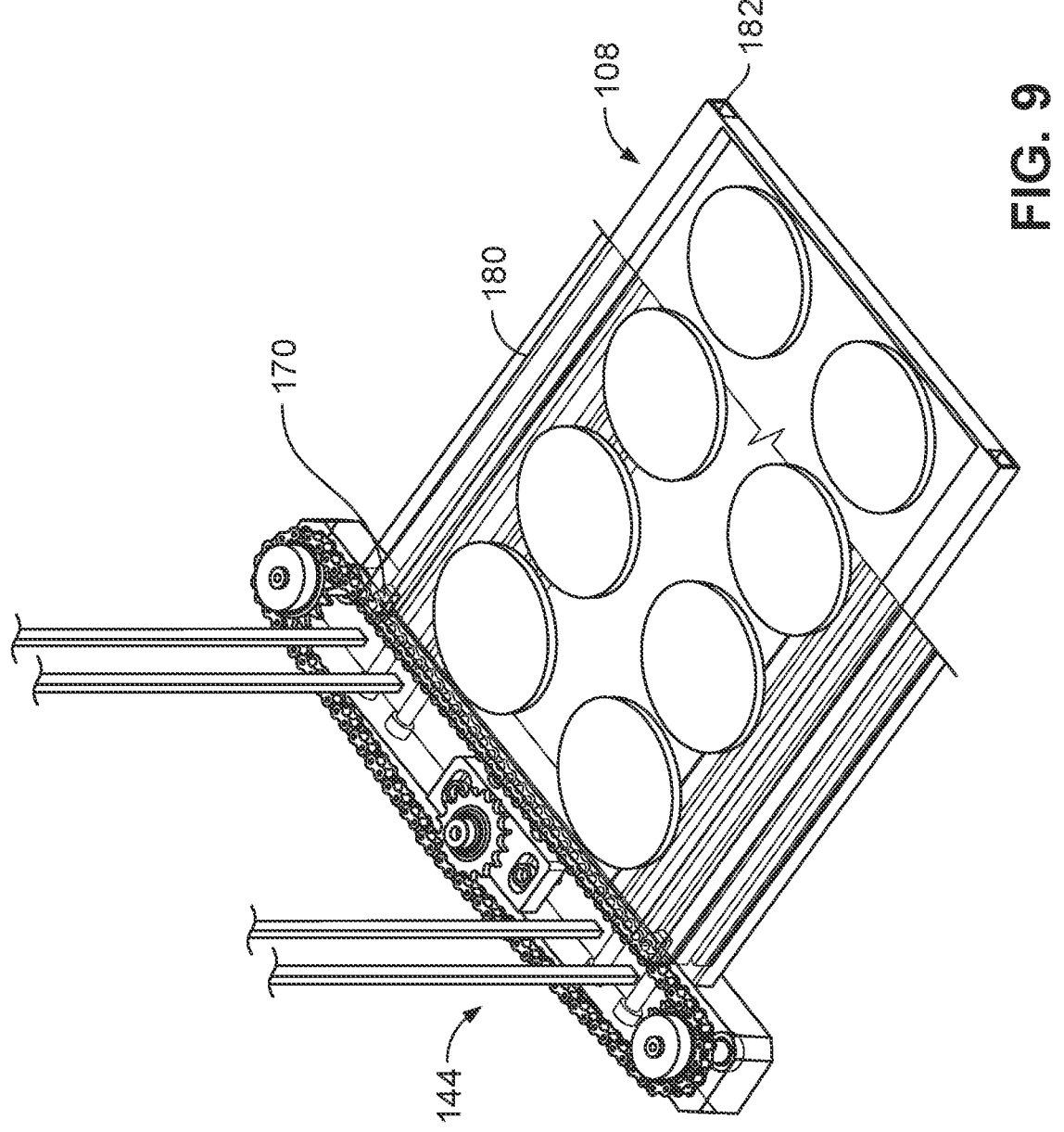

FIGS. 8 and 9 show the automated elevator 114 and a tray 108 during the loading or unloading of the tray 108. As shown in FIG. 8, the extractor 144 of the elevator 114 has a car or platform 145 with a top surface 158 that supports the tray 108 when the tray 108 is on the extractor 144. For example, the extractor 144 can have two side frames 172 (only one frame 172 shown in FIG. 8) and two arms 160 extending perpendicular with respect to and between the two side frames 172. The two arms 160 are spaced from each other and can define the top surface 158 that supports the tray 108. In some implementations, the extractor 144 can have a continuous support surface instead of the two arms 160. The arms 160 can have slots 161 that receive a ridge or a raised feature of the bottom surface of the tray 108 to securely receive the tray 108 and to keep the tray 108 from moving during the vertical movement of the extractor 144.

The automated elevator 114 also includes one or more elevator drives 152 (e.g., an electric motor), one or more elevator chains or belts 150, one or more guide rails or shafts 154, end gears 156 engaged with each elevator chain 140, and shafts 157 connected to opposite elevator chains or belts. The drives 152 can be attached to the frame (e.g., the wall, floor, or ceiling) of the vertical component storage system 100. Each chain 150 is engaged to two end gears 156 (only the top end gear shown in FIG. 8). The extractor 144 is attached to the chains 150. For example, each side frame 172 is attached to and movable by a respective elevator chain or chains 150. The chains 150 can extend through the side frames 172. The top end gear 156 can be driven by the elevator drive 152 to drive the chain 150 in a clockwise direction and counter clockwise direction to lift or lower the extractor. The drive 152 can also rotate a shaft 157 that has gears opposite top end gears 156 to engage and rotate chains (not shown) that engage the opposite side of the extractor 144. The elevator drive 152 is operably coupled to the controller (see FIG. 1) so that the controller controls the rotation direction and speed of the elevator drive 152. For example, the processor can determine the location (e.g., the height) of the designated bay, and the controller can move the drives 152 based on the location of the bay to position the extractor 144 at the predetermined location next to the designated bay.

Each side frame 172 has a drive assembly that includes a chain 162, engagement tabs or dogs 170, a drive gear 164, end gears 174, and a chain drive 166 (e.g., an electric motor). The chain drive 166 is attached to the side frame 172 at or near a middle point of the side frame 172. The drive gear 164 is attached to and rotated by the drive 166. The chain 1562 is engaged to the two end gears 174 and to the drive gear 164. In some implementations, one of the end gears can be the drive gear. The drive gear 164 can be driven by the chain drive 166 to drive the chain 162 in a clockwise and counter clockwise direction to load or unload the tray 108 to and from the extractor 144. The drive assembly can have two tabs 170 spaced from each other a distance corresponding to a distance that separates two apertures 182 of the tray. The tabs 170 engage the tray 108 by the apertures 182 to move the tray 108 in a horizontal direction "H" to load or unload the tray 108 to and from the extractor 144.

As shown in FIG. 8, the tray 108 contains multiple components 112. The tray 108 can have a support surface 184 and a frame 180 that defines the apertures 182. To load the tray 108 onto the extractor 144, the elevator 114 places the chain 162 of the extractor 144 along the horizontal plane of the apertures 182. The end gear 174 near the first aperture 182 to be engaged is sized and spaced from the aperture a distance such that the tab 170 enters the aperture 182 as the tab rotates along the end gear 174. Similarly, the gear 174 is arranged such that the following tab 170 enters the last aperture 182 as the tray 108 is loaded onto the extractor 144. As shown in FIG. 9, once the chain 162 is aligned with the apertures 182, the chain drive 162 drives the chain in a clockwise direction (in top view) so that the tabs engage the apertures to move the tray 108 and place the tray on top of the extractor 144. When the tray is on the extractor 144, the tabs 170 are disposed inside the apertures 182 of the tray 108.

To unload the tray 108, the chain drive 162 drives the chain in a counter clockwise direction so that the tabs, engaged with the apertures 182, move the tray 108 and place the tray on top of a horizontal surface (e.g., a floor of a bay or the support surface of the operator access station) adjacent the extractor 144.

Figure 10:
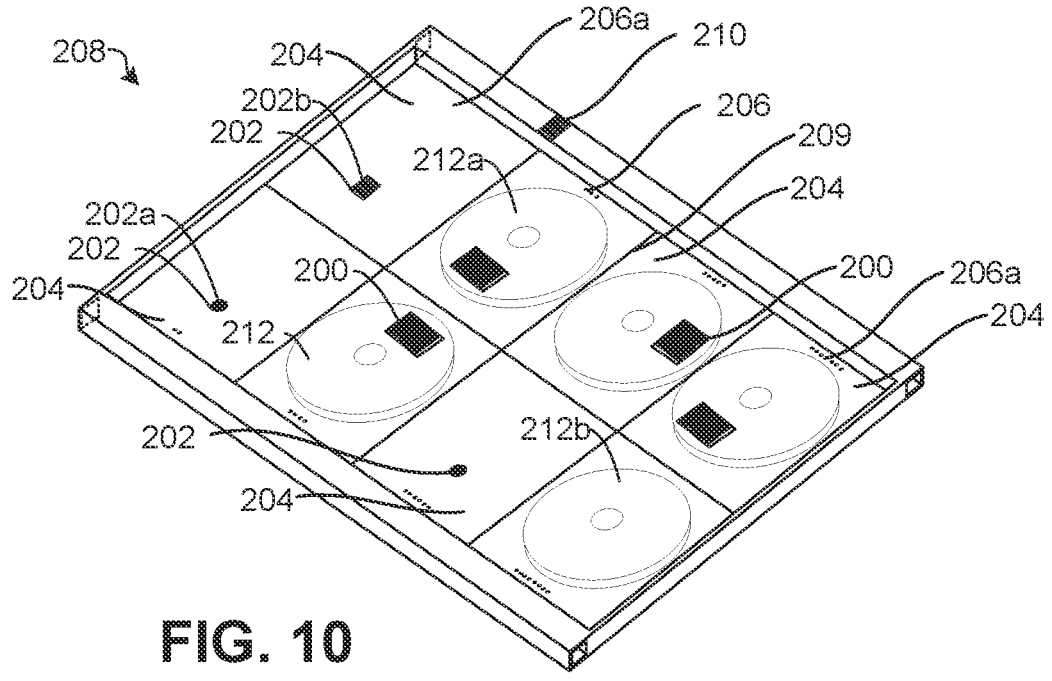
FIG. 10 is a perspective view of a tray according to a first implementation of the present disclosure.

FIG. 10 illustrates a loaded tray 208 according to a first implementation of the present disclosure. The tray 208 includes multiple discrete tray storage locations or spaces 204. Each space 204 can be arranged to contain one component 212 such as one reel or one hand tool. Because the camera of the operator access station is fixed in place, the processor can determine, based on the image captured by the camera, the location of the each space 204 by the position of each space 204 in the image. For example, the processor can determine the location of each space 204 based on processing the image by dividing the image or the tray 208 in a symmetrical or asymmetrical grid that corresponds with the tray 208. For example, each tray 208 can have an associated grid (e.g., a four, six, or eight square grid) and the processor can determine, after identifying the tray 208 from the image, what type of grid corresponds with the tray 208. Upon determining the type of grid that corresponds with the tray 208, the processor can divide the image with the corresponding grid to determine which component 212 is in which location or space 204 of the tray.

In some cases, the tray 208 can include visual lines 209 or shapes that make up the grid or that otherwise delineate the boundaries of each space 204 so that the image shows the spaces 204. Having marked trays 208 with delineated boundaries can simplify the process or reduce the steps needed to determine the location of each component 212.

In some implementations, each space or location 204 can have an identifier 202 on the tray 208. The identifier 202 can be used to determine the location of each space 204, and also to determine if the component 212 has been placed upright or upside down. The identifier 202 can be a simple binary mark 202a (e.g., a black dot) or machine-readable code 202b

(e.g., a bar code) containing information, such as the identity and location of the empty space 204. Additionally, the processor can determine the boundary of each space 204 based on a distance from the identifier 202 or based on information contained in the identifier 202. For example, the machine-readable code 202*b* can contain information about the location of its respective space 204 (the space containing the code 202*b*) and information delineating the boundary of its respective space 204. The processor can decode the machine-readable code 202*b* and determine the position of the space 204 within the tray 208 and determine the boundary of the space 204.

Additionally, each component 212 can have a machine-readable code 200 on one side of the component. The processor uses the code 200 to identify the component (e.g., what type of electronic components the reel has) and associate the component 212 to its respective space 204. The space identifier 202 is exposed when no component 212 is in the respective component storage location 204, and covered when a component 212 is in the component storage location 204. Because the identifier 202 is covered when a component 212 is loaded on the space 204, if a space 204 does not show a location identifier 202 or a component identifiers 200, the processor can determine that the component 212 in the space 204 is upside down or that there is another issue such that there is no visible identifier. For example, the component 212 in the location may not have a component identifier, or the component identifier may be covered by another component. In turn, the system can notify the operator by display an error message and illuminating the location on the tray. For example, if the system determines that the component 212 is upside down, the system can prompt the operator to flip the component 212. Thus, the processor determines, based on a presence or absence of the identifiers 200, 202 in the image taken by the camera, which one of the discrete component storage locations 204 is empty and which one of the locations 204 contains a component 212.

Additionally, each component 212 can have two or more machine-readable codes. For example, one code can be associated with the electronic part of the reel, and the other code can be associated with the reel for inventory purposes.

As shown in FIG. 10, some components 212 are facing up and one component 212*b* is facing down, with its machine-readable code facing the support surface of the tray 208. The processor can determine, based on determining that a location 204 does not show an identifier, that the component 212*b* is upside down and can notify the operator to turn the component 212 and prevent the component 212 from being stored upside down. Thus, the processor associates the component identifier 200 with its respective location 204, and once a component 212 is to be retrieved, the system can indicate to the operator exactly where the component 212 to be retrieved is located on the tray 208.

In some implementations, the processor can determine the place of each space 204 by using secondary space identifiers 206. For example, each space 204 can have a binary mark 206 (or a machine-readable code) that is visible whether or not the space 204 contains a component 212. For example, the mark 206 can be a number of black dots 206*b* associated with the space 204. For example, if the tray 208 has eight spaces 204 as illustrated in FIG. 10, the first space can have one dot, the second space can have two dots, and so on until the eighth space with eight dots. The processor can associate each identifier 206 with a particular location of the space 204 in the tray 208. In some cases, the tray 204 can have no grid or location identifiers 206, and the camera can identify the analog (X,Y) location of the component 212, or locate each component 212 by quadrant.

Still referring to FIG. 10, each component 212 can have a different orientation. Thus, the position of each identifier 200 can vary within the space 204. Because the system determines the boundary of each space 204 and each identifier 200 is within its boundary, the system associates each identifier 200 with its correct space 204.

Additionally, the tray 208 can have a visible tray identifier 210. The identifier 210 can be a machine-readable code containing information about the tray and about the spaces 204 in the tray 208. For example, each tray 208 can have an associated grid or arrangement of spaces 204 and the processor can determine, after identifying the tray 208 using its identifier 210, the number, location, size, and other parameters of the spaces 104 in that tray 208. Additionally, the system can associate each component 212 with its space 204, and can associate the tray 208 with the components 212 in the tray 208.

The location information of each component 212 within its tray 208 can be used later when retrieving the component from the tray. For example, the vertical component storage system 100 can radiate light unto the component or tool associated with the location on the tray 208. Thus the vertical component storage system 100 can automatically detect incoming components to be stored and automatically retrieve components from the stack of storage locations.

Figure 11:
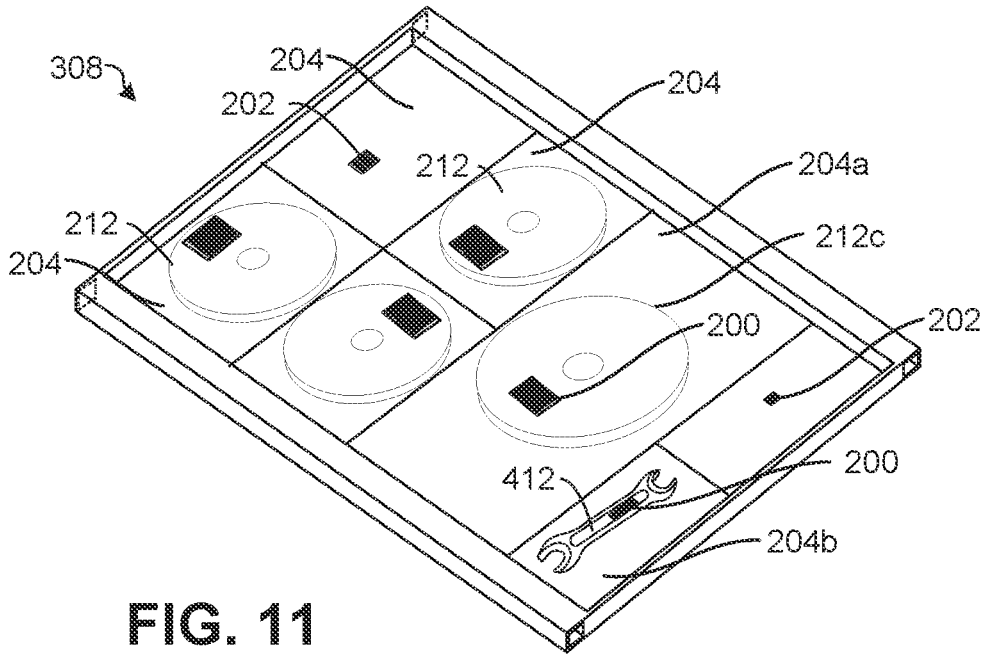
FIG. 11 is a perspective view of a tray according to a second implementation of the present disclosure.

FIG. 11 illustrates a tray 308 similar to the tray 208 in FIG. 19. The tray 308 includes multiple discrete tray storage locations 204, some of different sizes. Each location 204 can be defined by a grid similar to the grid of the tray 208 in FIG. 10, but with spaces 204 of different sizes. For example, a large component 212*c* can be placed on a large tray storage location 204*a*, and a small component 412 (e.g., a hand tool) can be placed on a small tray storage location 204*b*. If the system detects a component identifier 200 and a space identifier 202 in the same space, the system can determine that a small component was placed in the large space 204*a*.

Figure 12:
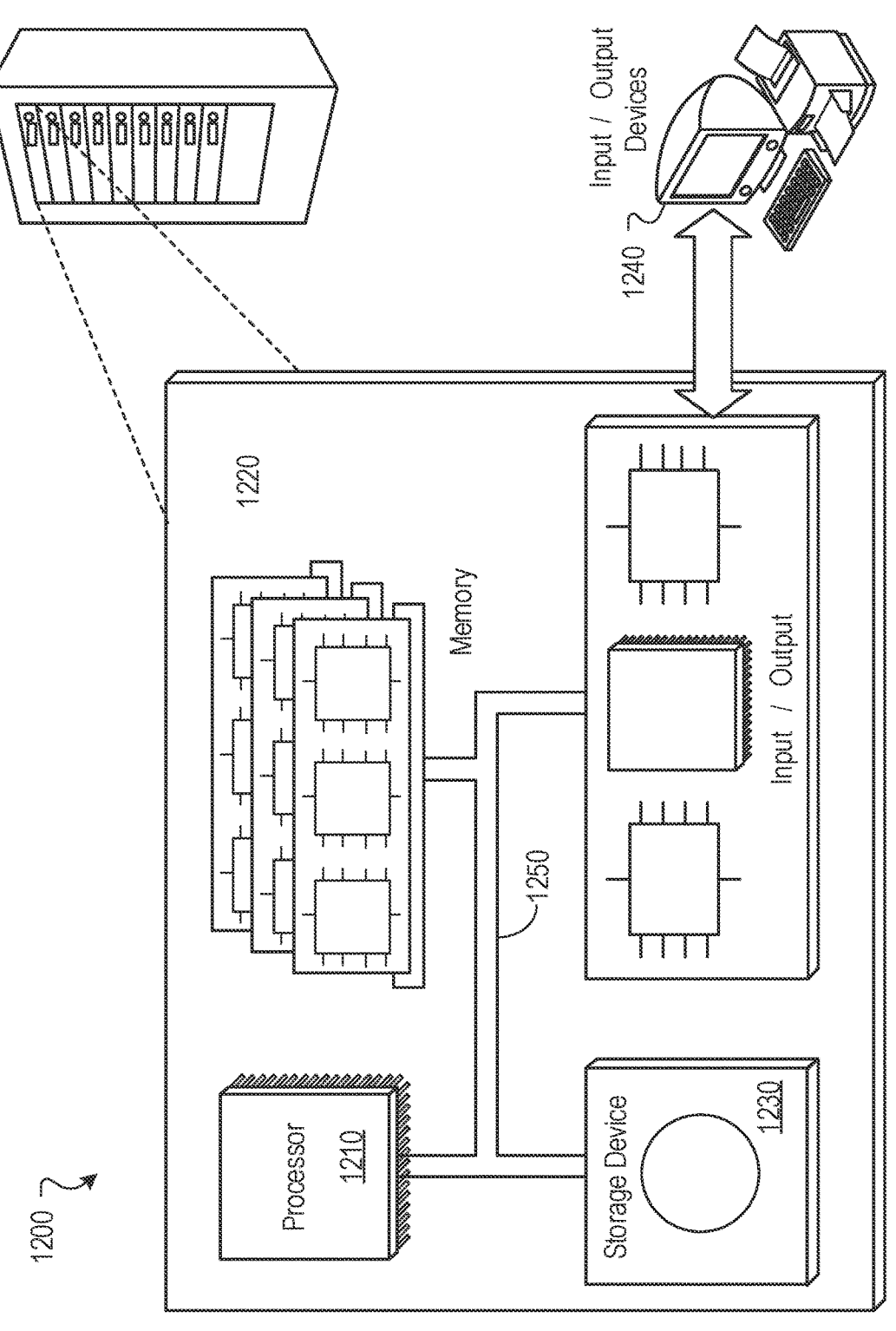
FIG. 12 is a schematic illustration of an example control system or controller of the vertical component storage system.

FIG. 12 is a schematic illustration of an example control system or controller for a vertical component storage system according to the present disclosure. For example, the controller 1200 may include or be part of the controller 123 shown in FIG. 1. The controller 1200 is intended to include various forms of digital computers, such as printed circuit boards (PCB), processors, digital circuitry, or otherwise. Additionally, the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1200 includes a processor 1210, a memory 1220, a storage device 1230, and an input/output device 1240. Each of the components 1210, 1220, 1230, and 1240 are interconnected using a system bus 1250. The processor 1210 is capable of processing instructions for execution within the controller 1200. The processor may be designed using any of a number of architectures. For example, the processor 1210 may be a CISC (Complex Instruction Set Computers) processor, a RISC (Reduced Instruction Set Computer) processor, or a MISC (Minimal Instruction Set Computer) processor.

In one implementation, the processor 1210 is a single-threaded processor. In another implementation, the processor 1210 is a multi-threaded processor. The processor 1210 is capable of processing instructions stored in the memory 1220 or on the storage device 1230 to display graphical information for a user interface on the input/output device 1240.

The memory 1220 stores information within the controller 1200. In one implementation, the memory 1220 is a computer-readable medium. In one implementation, the memory 1220 is a volatile memory unit. In another implementation, the memory 1220 is a non-volatile memory unit.

The storage device 1230 is capable of providing mass storage for the controller 1200. In one implementation, the storage device 1230 is a computer-readable medium. In various different implementations, the storage device 1230 may be a floppy disk device, a hard disk device, an optical disk device, or a tape device. In various different implementations, the storage device 1230 may be a data base that allows the system to manage multiple storage stacks.

The input/output device 1240 provides input/output operations for the controller 1200. In one implementation, the input/output device 1240 includes a keyboard and/or pointing device. In another implementation, the input/output device 1240 includes a display unit for displaying graphical user interfaces.

Figure 13:
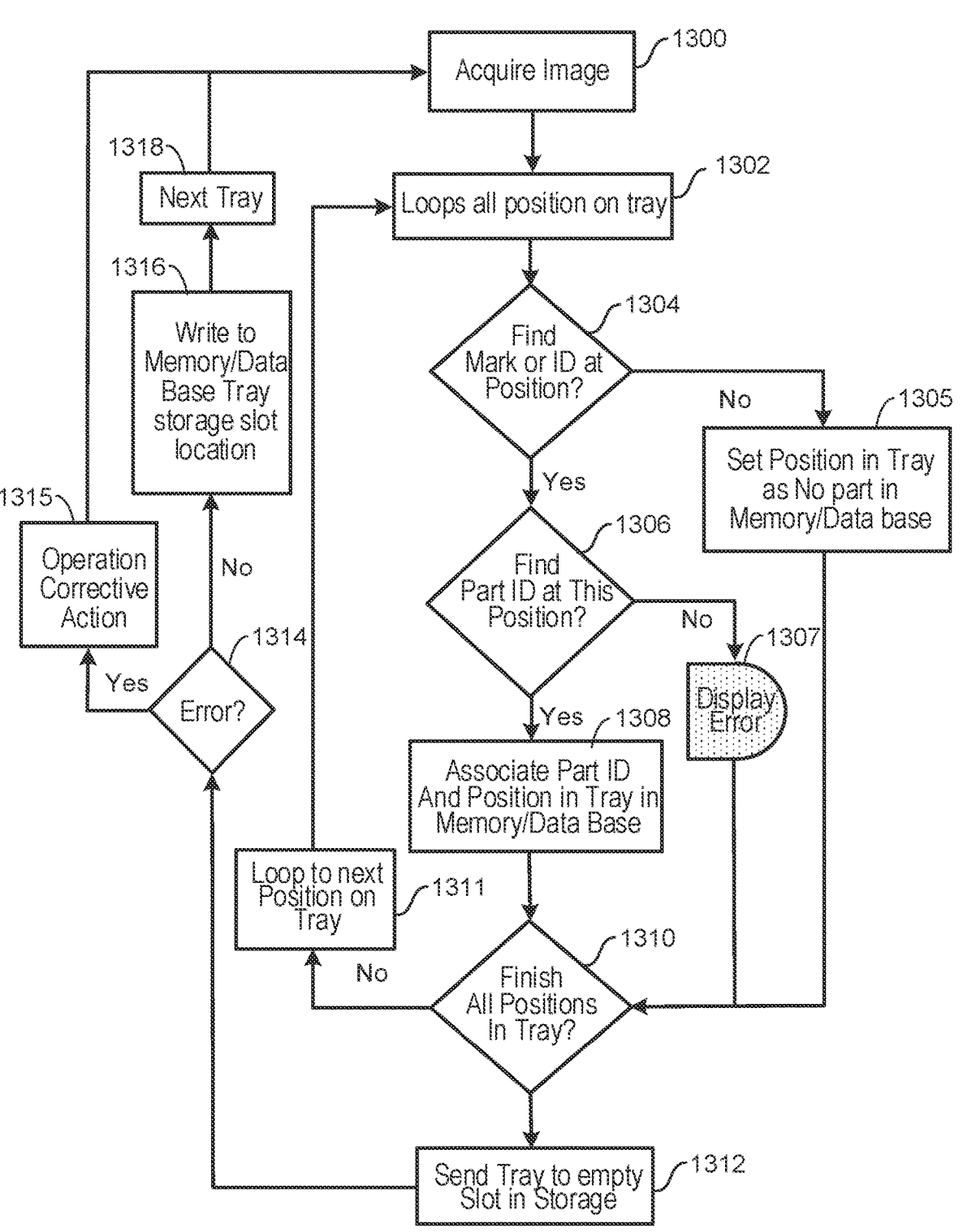
FIG. 13 is a flow chart of a logic algorithm with steps for storing a component.

FIG. 13 shows a flow chart of a logic algorithm with steps that the system (e.g., the processor) can take when storing a component. With a tray on the operator access station, the system, at block 1300, can acquire an image of the tray. Then, at block 1302, the system can loop all positions on the tray. Then, at block 1304, the system can determine if a mark or ID at the position or location has been found. If not, the system can display an error (e.g., stating that a reel is possibly upside down) or, at block 1305, can set the position or location in the memory or data base as having no part. If yes, the system, at block 1306, can determine if a part ID at this position or location has been found. If not, at block 1307, the system can display an error. If yes, at block 1308, the system can associate the part ID to the position in the tray and save such association in the memory or data base. Then, at block 1310, the system can determine if all positions in the tray have been finished or evaluated. If not, the system can, at block 1311, loop to the next position on the tray and then go back to block 1302. If yes, at block 1312, the system can send the tray to an empty slot in the storage. Then, at block 1314, the system can determine if an error has been detected. If yes, the system, at block 1315, can wait for or prompt an operator to perform a corrective action. For example, the system can prompt an operator to recalibrate they system (e.g., the elevator assembly). If not, the system can, at block 1316, store the tray storage slot location where the tray has been stored. Lastly, at block 1318, the system can process the next tray.

While a number of examples have been described for illustration purposes, the foregoing description is not intended to limit the scope of the invention, which is defined by the scope of the appended claims. There are and will be other examples and modifications within the scope of the following claims.

What is claimed is:

1. A component storage and retrieval system, comprising:
a storage stack defining discrete tray storage locations at different levels;
an operator access station comprising a surface adapted to support a movable tray; and
an automated elevator configured to move a tray from the access station surface to a designated one of the discrete tray storage locations of the storage stack, and to retrieve a selected tray from the storage stack and bring the selected tray to the access station,
wherein the access station comprises a fixed camera positioned such that a tray supported on the surface is within a field of view of the camera, the field of view spanning multiple discrete component storage locations of the tray, and
wherein the camera is configured to generate data representing an image of the tray, from which the system is configured to (a) identify a component on the tray, and (b) identify a discrete component storage location of the tray on which the identified component is located; and
wherein the system is configured to communicate the identified discrete component storage location of the tray to an operator at the operator access station;
wherein each discrete component storage location of the tray comprise an identifier comprising at least one of a marker or a machine readable code, the identifier exposed when no component is in the discrete component storage location, and covered when a component is in the discrete component storage location, and wherein the system is configured to determine, based on a presence or absence of the identifier in the image, which one of the discrete component storage locations is empty and which one of the discrete component storage locations contains a component.

2. The component storage and retrieval system of claim 1, wherein the storage stack comprises a vertical storage rack comprising a frame defining a plurality of stacked bays each arranged to receive and store a respective tray, and each one of the discrete tray storage locations comprises a bay of the plurality of stacked bays.

3. The component storage and retrieval system of claim 1, wherein the operator access station comprises a first bay of the plurality of stacked bays, the first bay defining a height larger than a height of the rest of bays of the plurality of stacked bays.

4. The component storage and retrieval system of claim 1, wherein the operator access station comprises a ceiling spaced from the surface of the operator access station, and the camera is fixed to the ceiling over the tray with the field of view of the camera directed toward the tray supported on the surface of the operator access station.

5. The component storage and retrieval system of claim 4, wherein the field of view of the camera spans all of the discrete component storage locations of the tray.

6. The component storage and retrieval system of claim 4, further comprising one or more additional cameras fixed to the ceiling of the operator access station, and wherein the fixed camera is arranged such that the field of view of the fixed camera spans a first group of the multiple discrete component storage locations, and the one or more additional cameras are arranged such that the field of view of the one or more additional cameras span a second group of the multiple discrete component storage locations different than the first group.

7. The component storage and retrieval system of claim 1, wherein the automated elevator comprises i) an elevator drive coupled to a frame of the storage stack, ii) an elevator chain engaged with and configured to be driven by the elevator drive, iii) and an extractor attached to the elevator chain, the elevator drive comprising a rotatable gear engaged with the elevator chain such that rotation of the gear moves the extractor vertically to position the extractor adjacent a selected of the discrete tray storage locations to store or retrieve a respective tray.

8. The component storage and retrieval system of claim 7, wherein the extractor comprises i) an extractor drive comprising an extractor gear, ii) an extractor chain engaged with and configured to be driven by the extractor drive, and iii) one or more tabs secured to and movable by the extractor chain along a horizontal plane of the extractor, the one or more tabs arranged to engage, upon rotation of the extractor gear, a respective tray to move the respective tray to and from a support surface of the extractor to store or retrieve the respective tray.

9. The component storage and retrieval system of claim 1, further comprising an illumination source attached to or near the operator access station and configured to radiate light, wherein the storage and retrieval system is configured to, during retrieval of a component on a tray, communicate an identified component location to the operator at the operator access station by radiating the light only on the identified component on the tray.

10. The component storage and retrieval system of claim 1, wherein each component comprises a unique component machine readable code associated with the respective component, and wherein the system is configured to associate the unique component machine readable code of each component with the tray and with a respective discrete component storage location within the tray.

11. The component storage and retrieval system of claim 1, wherein the component comprises an electrical component reel or a hand tool.

12. A component storage and retrieval system, comprising
a storage stack defining discrete tray storage locations at different levels;
an operator access station comprising a surface adapted to support a movable tray;
an automated elevator configured to move a tray from the access station surface to a designated one of the storage locations of the storage stack, and to retrieve a selected tray from the storage stack and bring it to the access station; and
a set of trays, each tray adapted to be accommodated in at least one of the tray storage locations of the storage stack, and on the operator access station surface, and to be carried by the automated elevator;
wherein each tray defines multiple discrete reel positioning areas, each area bearing a mark that is visible from above the tray when the area is void of reels;
wherein the access station comprises a fixed camera positioned such that a tray of the set of trays is within a field of view of the camera when supported on the surface, the field of view spanning the multiple discrete reel positioning areas of the tray, and
wherein the camera is configured to generate data representing an image of the tray, from which the system is configured to (a) identify whether a reel is disposed in each of the reel positioning areas of the tray; (b) identify a reel positioned on the tray, and (c) associate the identified reel with one of the reel positioning areas based on where the identified reel is located; and
wherein the system is configured to communicate the identified reel location to an operator at the operator access station;
wherein each discrete component storage location of the tray comprise an identifier comprising at least one of a marker or a machine readable code, the identifier exposed when no component is in the discrete component storage location, and covered when a component is in the discrete component storage location, and wherein the system is configured to determine, based on a presence or absence of the identifier in the image, which one of the discrete component storage locations is empty and which one of the discrete component storage locations contains a component.

13. The component storage and retrieval system of claim 12, wherein the storage stack comprises a vertical storage rack comprising a frame defining a plurality of stacked bays each arranged to receive and store a respective tray, and each one of the discrete tray storage locations comprises a bay of the plurality of stacked bays.

14. The component storage and retrieval system of claim 12, wherein the operator access station comprises a ceiling spaced from the surface of the operator access station, and the camera is fixed to the ceiling over the tray with the field of view of the camera directed toward the tray supported on the surface of the operator access station.

15. The component storage and retrieval system of claim 14, wherein the field of view of the camera spans all of the discrete component storage locations of the tray.

16. The component storage and retrieval system of claim 14, further comprising one or more additional cameras fixed to the ceiling of the operator access station, and wherein the fixed camera is arranged such that the field of view of the fixed camera spans a first group of the multiple discrete component storage locations, and the one or more additional cameras are arranged such that the field of view of the one or more additional cameras span a second group of the multiple discrete component storage locations different than the first group.

17. The component storage and retrieval system of claim 12, wherein each component comprises a unique component machine readable code associated with the respective component, and wherein the system is configured to associate the unique component machine readable code of each component with the tray and with a respective discrete component storage location within the tray.

18. A method, comprising:
receiving, by a processing device and from a camera of a component storage and retrieval system, data representing an image of at least a portion of a tray, the component storage and retrieval system comprising i) a storage stack defining discrete tray storage locations at different levels, ii) an operator access station comprising a tray support surface, and iii) an automated elevator configured to move a tray between the tray support surface and a designated one of the storage locations of the storage stack, wherein the image comprises multiple discrete component storage locations of the tray;
identifying, by the processing device and based on the data received from the camera, a component on the tray;
identifying, by the processing device and based on the data received from the camera, a discrete component storage location of the tray on which the identified component is located; and
communicating the identified discrete component storage location to an operator at the operator access station;
wherein each discrete component storage location of the tray comprises a machine readable code that is exposed when no component is in the discrete component storage location, and covered when a component is in the discrete component storage location, and wherein the system is configured to determine, based on each machine readable code, a location of a free or occupied discrete component storage location of the tray associated with each machine readable code.

19. A component storage and retrieval system, comprising:

a storage stack defining discrete tray storage locations at different levels;

an operator access station comprising a surface adapted to support a movable tray; and an automated elevator configured to move a tray from the access station surface to a designated one of the discrete tray storage locations of the storage stack, and to retrieve a selected tray from the storage stack and bring the selected tray to the access station, wherein the access station comprises a fixed camera positioned such that a tray supported on the surface is within a field of view of the camera, the field of view spanning multiple discrete component storage locations of the tray, and wherein the camera is configured to generate data representing an image of the tray, from which the system is configured to (a) identify a component on the tray, and (b) identify a discrete component storage location of the tray on which the identified component is located; and wherein the system is configured to communicate the identified discrete component storage location of the tray to an operator at the operator access station;

wherein the automated elevator comprises i) an elevator drive coupled to a frame of the storage stack, ii) an elevator chain engaged with and configured to be driven by the elevator drive, iii) and an extractor attached to the elevator chain, the elevator drive comprising a rotatable gear engaged with the elevator chain such that rotation of the gear moves the extractor vertically to position the extractor adjacent a selected of the discrete tray storage locations to store or retrieve a respective tray; and wherein the extractor comprises i) an extractor drive comprising an extractor gear, ii) an extractor chain engaged with and configured to be driven by the extractor drive, and iii) one or more tabs secured to and movable by the extractor chain along a horizontal plane of the extractor, the one or more tabs arranged to engage, upon rotation of the extractor gear, a respective tray to move the respective tray to and from a support surface of the extractor to store or retrieve the respective tray.

* * * * *